(12) United States Patent
Morgan et al.

(10) Patent No.: US 6,320,406 B1
(45) Date of Patent: Nov. 20, 2001

(54) METHODS AND APPARATUS FOR A TERMINATED FAIL-SAFE CIRCUIT

(75) Inventors: Mark W. Morgan, Allen; Fernando D. Carvajal, Fairview; Kevin J. Gingerich, Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/677,340

(22) Filed: Oct. 2, 2000

Related U.S. Application Data
(60) Provisional application No. 60/157,631, filed on Oct. 4, 1999.

(51) Int. Cl.[7] .................................................. H03K 9/007
(52) U.S. Cl. ................................. 326/14; 326/83; 326/86; 326/9
(58) Field of Search .................................. 326/9, 14, 86, 326/83; 327/77–79

(56) References Cited

U.S. PATENT DOCUMENTS

| | | | |
|---|---|---|---|
| 4,636,660 | * | 1/1987 | Gelabert ................................. 307/442 |
| 4,641,145 | * | 2/1987 | Darrow ................................. 307/350 |
| 4,859,872 | * | 8/1989 | Hyakutake ............................ 307/269 |
| 5,065,047 | * | 11/1991 | Igari et al. ............................ 307/442 |
| 6,184,700 | * | 2/2001 | Morris ..................................... 326/14 |
| 6,201,405 | * | 3/2001 | Hedberg ................................. 326/30 |

\* cited by examiner

Primary Examiner—Michael Tokar
Assistant Examiner—Vibol Tan
(74) Attorney, Agent, or Firm—J. Dennis Moore; W. James Brady, III; Frederick J. Telecky, Jr.

(57) ABSTRACT

An active fail-safe method and apparatus for a LVDS receiver that uses a window comparator circuit to monitor the differential voltage at the receiver's input pins and drive the output to a known logic HIGH state in the absence of a valid input signal; i.e., when the input differential signal is less than a chosen threshold value of approximately 80 mV. Such a condition may occur when the cable is removed or damaged in such a way that no valid input signal is present. In the presence of a valid input signal, the circuit's output tracks the differential input without any degradation to the signal.

21 Claims, 6 Drawing Sheets

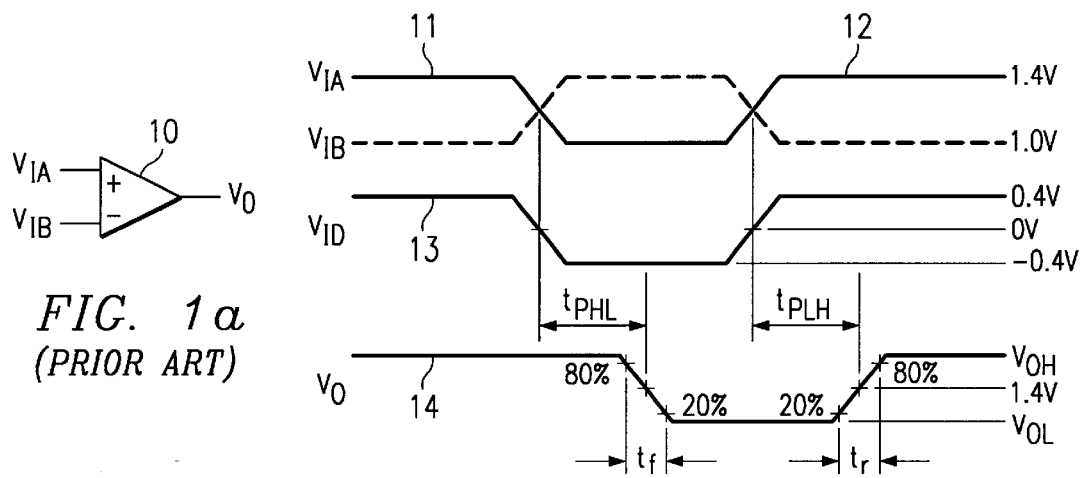
FIG. 1a
(PRIOR ART)
FIG. 1b
(PRIOR ART)
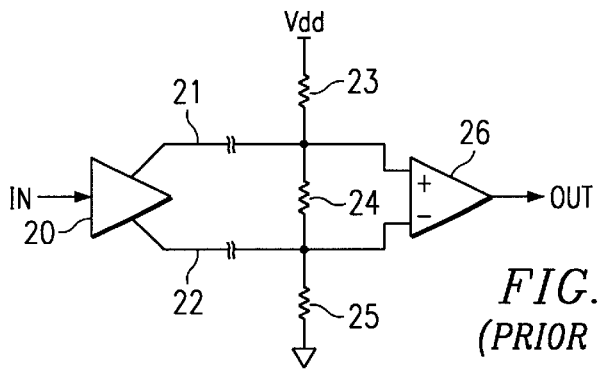
FIG. 2
(PRIOR ART)
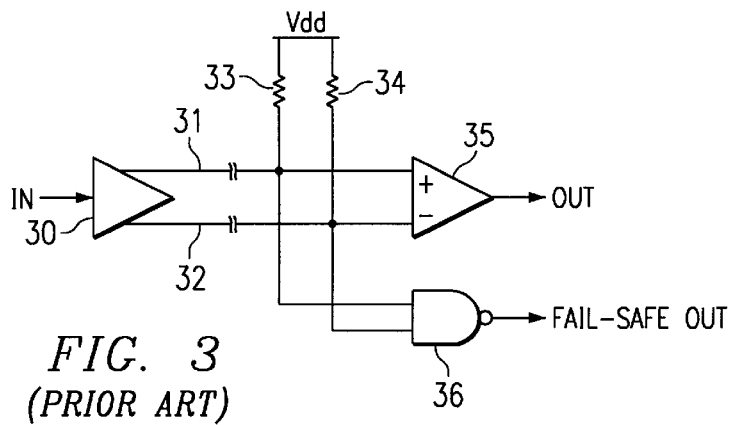
FIG. 3
(PRIOR ART)

METHODS AND APPARATUS FOR A TERMINATED FAIL-SAFE CIRCUIT

This application claims priority under 35 U.S.C. §119(e)(1) of provisional application No. 60/157,631 filed Oct. 4, 1999.

BACKGROUND OF THE INVENTION

1. Field of the Invention

This invention relates to differential data line receivers and more particularly to methods and apparatus for preventing such circuits from switching on noise in the absence of an input signal.

2. Description of Background Art

Low voltage differential signals (LVDS) are being used more and more to meet the need for faster data transmission. Because these differential signals can typically have a valid input voltage swing, between positive and negative signal levels, of as low as 350 mV, they tend to be much faster and use less power than conventional rail-to-rail circuits. Typically, such circuits can operate at speeds up to 655 MHz, while dissipating only one-eighth the power of conventional rail-to-rail circuits. Standards such as ANSI TIA/EIA-644 and IEEE 1596.3 dictate the use of these low voltage differential signals in system applications. In addition, these low voltage differential circuits are inherently more immune to common-mode noise and common-mode signal reflections.

FIG. 1a shows a LVDS receiver 10 with positive and negative inputs of the differential signal $V_{IA}$ and $V_{IB}$, respectively, and output $V_O$. FIG. 1b show the waveforms for a typical receiver circuit, where the differential input signal $V_{IA}$ 11 and $V_{IB}$ 12 have a swing of 400 mVolts (1.4–1.0 V). Internally, the circuit generates signal $V_{ID}$ 13, which switches between +0.4 and −0.4 volts and supplies a single-ended output signal $V_O$ 14, which switches at the application's TTL or CMOS digital HIGH $V_{OH}$ and LOW $V_{OL}$ levels with rise and fall times, $t_r$ and $t_f$, respectively.

A problem with typical LVDS circuits has been that the receiver can switch, and even oscillate, on noise signals in the absence of an input signal. This is particularly true when the data line is terminated in low impedance. This operating state can occur when the data source is turned OFF, for example in the case of wired-OR signaling being used in data bus arbitration, or when the interconnecting cable is removed or damaged, causing a short.

To overcome the problems discussed above, fail-safe circuits are commonly used to prevent LVDS receivers from switching on input noise. Current LVDS fail-safe solutions require either external components with subsequent reduction in signal quality or integrated solutions with limited application. An external fail-safe circuit used to provide a known receiver output in the absence of an input signal is shown in FIG. 2. This circuit consists of a differential line driver 20, an LVDS receiver 26, a differential cable for the positive 21 and negative 22 signals, a cable terminating resistor 24, a positive signal pull-up resistor 23 tied to $V_{dd}$, and a negative signal pull-down resistor 25 tied to circuit GND or $V_{ss}$. This approach maintains a DC offset voltage in the absence of a valid input signal, but the presence of the bias network can unbalance the driver output loop, causing additional leakage currents in the resistors, which can possibly distort and reduce the amplitude of the receiver's output signal. This increases the likelihood of the circuit switching or oscillating on input noise in the absence of a valid input signal. In addition, this solution tends to lower the input signal magnitude, reducing the differential noise margin and also can introduce an offset in the receiver, thereby requiring larger input signals to make it switch.

FIG. 3 shows one typical method of solving this problem using an integrated solution, including a resistor network, which applies a steady-state bias voltage to the undriven input pins. The circuit consists of a differential line driver 30, a differential cable for the positive 31 and negative 32 signals, two external pull-up resistors 33–34, an LVDS receiver 35, and fail-safe logic implemented as a NAND gate 36. The NAND gate 36 for the fail-safe function is shown attached effectively in parallel with the input of the receiver 35. In operation, in the absence of an input signal this approach pulls both inputs to the positive bias voltage level. The fail-safe logic senses this condition with both inputs of the NAND gate 36 going HIGH, driving the output LOW. This signal in turn can be used to drive the output of the receiver 35 to a known logic state. However, the pull-up to $V_{CC}$ tends to be defeated by the applied voltage and as a result, these circuits are often limited to open-circuit conditions or are restricted to only certain, limited operating conditions.

A second integrated fail-safe circuit, which relies on bias currents integrated internally into the receiver, is illustrated in FIG. 4. This configuration consists of a differential line driver 40, a differential cable for the positive signal 41 and the negative signal 42, a terminating resistor 43, and an integrated LVDS receiver 44 with bias sources consisting of a positive current source 45 and negative current sink 46. These bias sources provide a current through the termination resistor 43 to assure that a DC voltage is maintained across the resistor when a valid input signal is not present, thereby maintaining the receiver output at a known voltage level. Although these small bias currents do not appreciably affect the input signal magnitude, one disadvantage of this existing fail-safe solution is that the bias currents are not always able to generate the required differential when an external common-mode voltage is applied. Increasing these bias currents to alleviate this problem results in additional bus loading during normal operation. Also, the offset created when pulling the two differential signals apart increases the input signal magnitude required by the receiver to switch, and can cause pulse skew, which is the difference between the time needed for the receiver to switch from LOW-to-HIGH and the time required to switch form HIGH-to-LOW.

What is needed is a fail-safe method and apparatus for providing a known LVDS receiver output in the absence of an input signal that does not affect the performance of the receiver during normal operation, and without the need for external components. The invention disclosed herein addresses this need.

SUMMARY OF THE INVENTION

In its broader aspects, the present invention is a fail-safe circuit that provides a known logic level output in the absence of a differential input signal. Included are a relatively high-speed receiver having inputs coupled to a first and second differential input, and having an output. Also included is a window comparator that is also coupled to the first and second differential inputs. The window comparator includes first and second comparators, each having a first and a second differential input. The first input of the first comparator is coupled to the second input of the second comparator and to the second input of the receiver, while the second input of the first comparator is coupled to the first input of the second comparator and to the first input of the receiver. A timer is also provided, coupled to the output of the receiver. A logic circuit is provided, having inputs coupled to the outputs of the first and second comparators and to the output of the timer. The logic circuit provides an active output only when all inputs are active. Finally, an output buffer is provided, having inputs coupled to the output of the receiver and to the output of the logic circuit. The output buffer provides an output corresponding to the output of the receiver when the output of the logic circuit is inactive, and provides an output having a predetermined logic state when the logic circuit is active.

According to other aspects of the invention there is an active fail-safe method and apparatus for an LVDS receiver that uses a window comparator circuit to monitor the differential voltage at the receiver's input pins and drive the output to a known logic HIGH state in the absence of an input signal, for example, when the input differential signal is less than a predetermined threshold value.

Embodiments of the invention do not require conventional external resistor bias networks or internal bias current sources to generate an offset, and as a result need not affect the receiver input threshold nor add any significant bus loading to the circuit. Implementations can be made that operate over the entire input common-mode range of the receiver.

According to a preferred embodiment of the invention, a pair of precision differential window comparators are wired in parallel with an LVDS receiver to sense the differential voltage between the inputs. These active fail-safe comparators sense when the differential voltage drops below, for example 80 mV, and a timer circuit filters the response and drives the LDVS receiver's output buffer to the tri-state level or known HIGH state after an approximately 600 nSec delay time. The fail-safe function relies on the main receiver's hysteresis, for example 50 mV, to keep a fail-safe signal asserted. In the presence of a valid input signal, one of the window comparators always has a logic LOW state, allowing the output to track the differential input. Additionally, the window comparators of this embodiment operate over the entire input common-pact mode range of the receiver and do not impact normal operation of the circuit when a valid differential signal is present.

BRIEF DESCRIPTION OF THE DRAWINGS

The included drawings are as follows:

FIGS. 1a and 1b show a typical prior art LVDS receiver with differential input along with circuit waveforms.

FIG. 2 is a schematic for a conventional prior art LVDS receiver that uses an external pull-up resistor network to control the output in the absence of a differential input signal.

FIG. 3 is a schematic for a conventional prior art LVDS receiver that uses an external pull-up and pull-down resistor network to control the output in the absence of a differential input signal.

DETAILED DESCRIPTION OF THE PREFERRED EMBODIMENTS

A preferred embodiment of an LVDS receiver fail-safe circuit and method in accordance with the present invention uses a window comparator circuit to monitor the differential voltage at the receiver's input pins and detect when the differential input voltage is less than a predetermined value (for example, <80 mV) and then drives the receiver's output to a known logic level (for example, to the logic HIGH state). Because this new active fail-safe circuit requires no external resistor bias network or internal bias current sources to generate an offset, it neither affects the receiver input threshold nor adds any significant bus loading. Additionally, this window comparator operates over the entire input common-mode range of the receiver and does not impact normal operation of the circuit when a valid differential signal is present.

Figure 4:
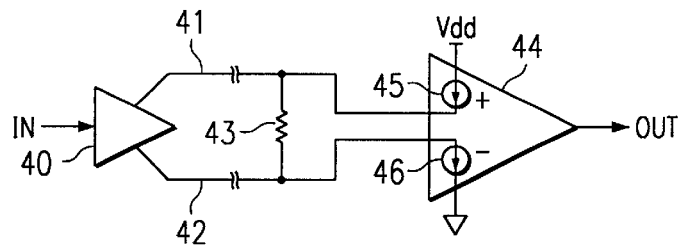
FIG. 4 is a schematic for a conventional prior art LVDS receiver that uses an integrated current source and current sink to control the output in the absence of a differential input signal.
Figure 5:
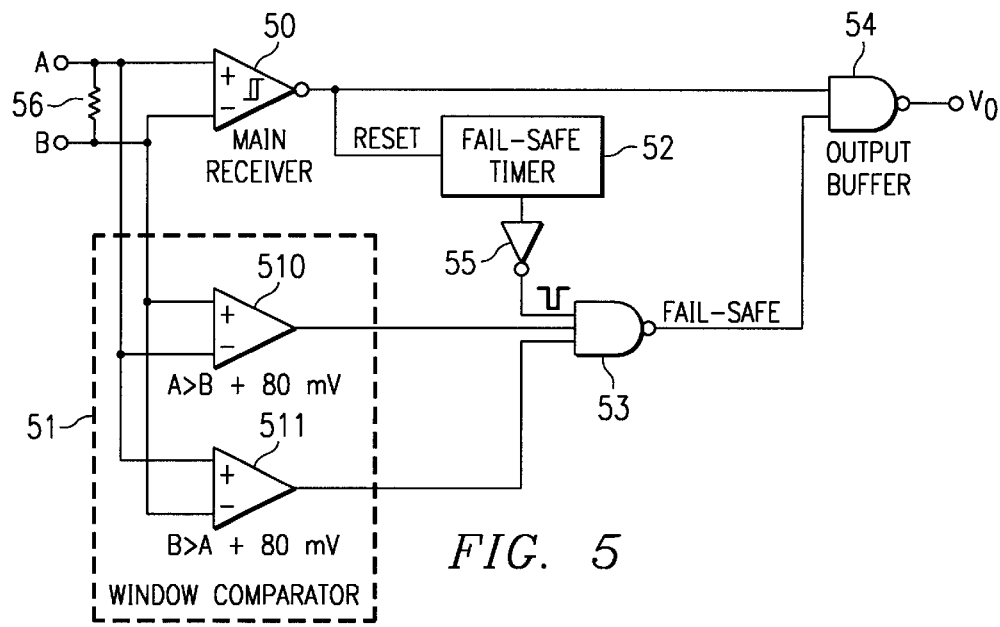
FIG. 5 is a block diagram for a preferred embodiment of a terminated fail-safe method in accordance with the present invention, which uses precision window comparators and a timer circuit to control the output in the absence of a differential input signal.

FIG. 5 is a block diagram for this preferred embodiment of the present invention, which uses a precision window comparator and timer circuit to control the output in the absence of a differential input signal. The precision window comparator comprises an LVDS receiver 50 with built-in hysteresis, which can respond to a high-speed, differential input signal made up of A and B inputs, and which is terminated in a resistor 56. Also connected to the input signal pair are two additional, much slower, fail-safe comparators 510–511 that form a second, non-precision window comparator 51. This second window comparator 51 has a much slower response than the LVDS receiver 50 and detects when the input differential falls below a chosen threshold value (for example, 80 mV). In addition, a fail-safe timer 52, which introduces a delay of approximately 600 nSec, is used to properly filter the window comparator outputs. An inverter 55 is used to provide the proper polarity for the fail-safe timer output signal, although this function can be incorporated into the fail-safe timer's 52 output logic. The output of the inverter 55 is provided as an input to a NAND gate 53. The other two inputs to NAND gate 53 are the outputs of window comparators 510/511. The output of NAND gate 53 is provided as an input to an output buffer 54, which is a two input NAND gate, the other input of which is the output of the LVDS receiver 50. The output of the output buffer 54 is the single-ended output signal $V_O$.

In operation, when the output of the LVDS receiver 50 switches, the fail-safe timer 52 is started and the window comparators 510/511 determine whether the two inputs are within 80 mV of each other, indicating that the input signal has been lost. If they are, both comparator 510/511 outputs go HIGH, enabling two inputs to the NAND gate 53. The circuit then waits for the 600 nSec timer to expire, or, time out, driving the third input to the NAND gate 53 HIGH through inverter 55. The output of the NAND gate 53 then goes LOW, inhibiting the output buffer 54 and driving it to a logic HIGH state until the input signal is restored.

During normal operation, when a valid differential input signal is present the fail-safe function is inhibited by one of the fail-safe comparators being LOW, allowing the output $V_O$ to track the input signal. The output signal switches when the input signal changes polarity and exceeds the circuit's hysteresis level (typically 50 mV). Each time the main receiver 50 switches, the fail-safe timer circuit 52 resets and begins timing from zero to approximately 600 nSec.

Figure 6:
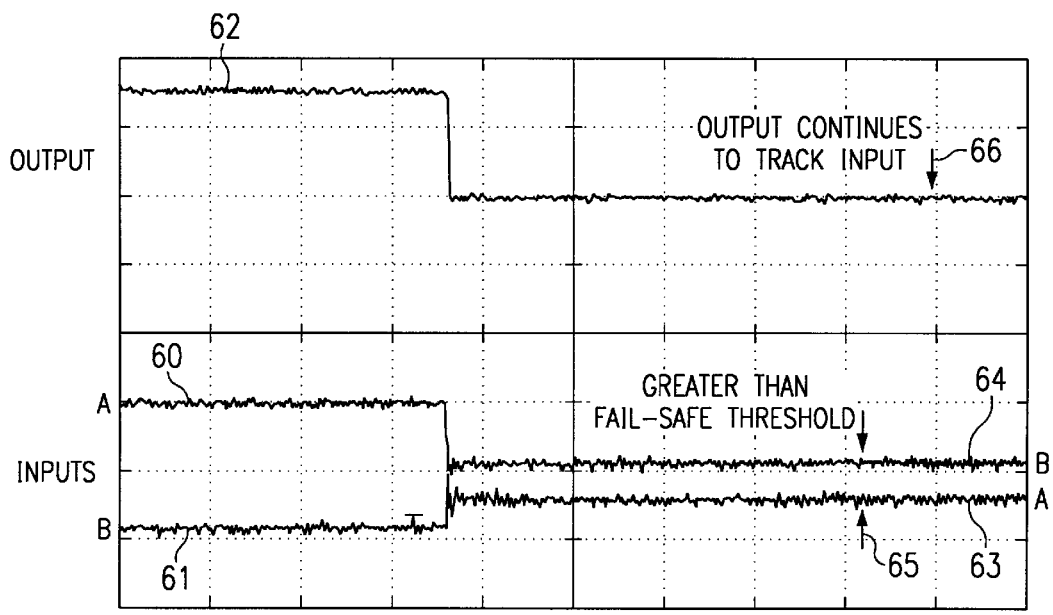
FIG. 6 are waveforms indicating the LVDS receiver operation, using a preferred embodiment of a fail-safe method in accordance with the present invention, with a valid differential input signal.

The following examples illustrate the operation of a preferred embodiment of the fail-safe method of the present invention. FIG. 6 illustrates the case for valid input conditions, where the input differential signal is greater than the threshold voltage (for example, >80 mV). In this case, the $\overline{\text{fail-safe}}$ signal from NAND gate 53 (FIG. 5) remains HIGH. Here input conditions begin with A 60 greater than B 61 by 400 mV and $V_O$, the output 62 of buffer 54, is HIGH. The differential input then switches polarity with B 64 being greater than A 63 by 100 mV 65, which is still greater than the fail-safe threshold of 80 mV. When the input switches, the output of the receiver is driven LOW 66 and the fail-safe timer 52 begins counting. After approximately 600 nSec, the timer output is set HIGH, enabling the fail-safe control input to NAND gate 53. However, since B>A+80 mV, the output of window comparator 511 remains LOW and the fail-safe logic, i.e., NAND gate 53, remains inhibited, allowing $V_O$, the output of output buffer 54, to remain at a logic LOW level, tracking the input signal.

Figure 7:
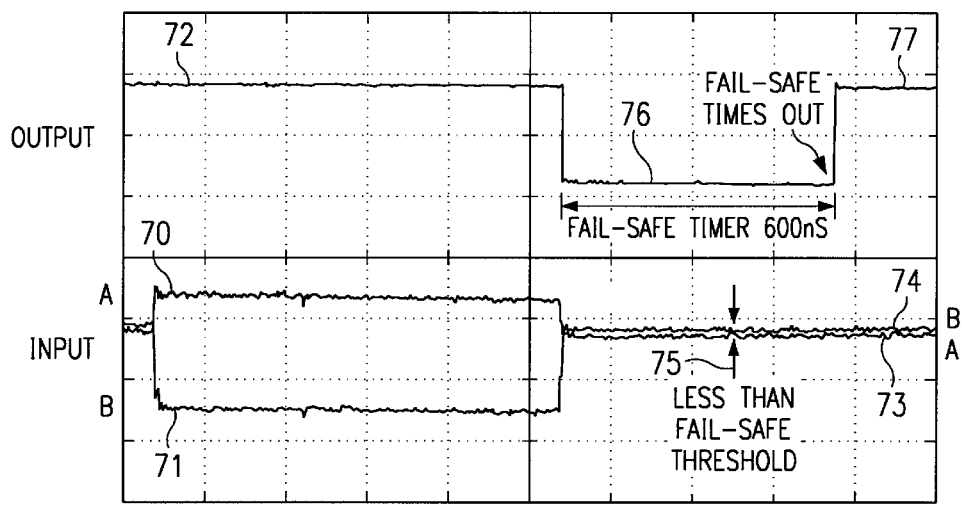
FIG. 7 are waveforms indicating the LVDS receiver operation, using a preferred embodiment of a fail-safe method in accordance with the present invention, with an invalid differential input signal, where the output is driven to a known state after a determined delay time.

FIG. 7 illustrates how a preferred embodiment of the active fail-safe method of the present invention functions when a valid input signal is lost. In this case, after the fail-safe timer times out, the input differential is still less than 80 mV, indicating an invalid input signal, so $V_o$ is driven to a known logic HIGH state. As before, beginning conditions are that signal A 70 is larger than B 71 by 400 mV and the output 72 is HIGH. However, in this case when the input switches polarity, signal B 74 is greater than signal A 73 by only 50 mV, which is less than the fail-safe threshold of 80 mV. Again, when the input switches, the output of receiver 50 (FIG. 5) is driven LOW and the fail-safe timer 52 is reset and begins timing. But this time the outputs of both window comparators 510/511, which are connected to two inputs of NAND gate 53, are at a logic HIGH state since B 74 is greater than A 73 by only 50 mV, which is less than the fail-safe threshold. Then, when the timer times out and returns to a logic HIGH state, all three inputs of NAND gate 53 are HIGH and its output goes LOW thereby inhibiting the output buffer 54 driving the circuit output to a known logic HIGH state. FIG. 7 shows the output of output buffer 54 being driven to this known logic HIGH state approximately 600 nSec after the input switched even though B 74 is greater than A 73, which is normally a LOW output condition. This is due to differential between signal A 74 and B 73 being less than the fail-safe threshold (80 mV) indicating that the input signal has been lost and the output buffer is in the tri-state mode. This condition continues until a valid input signal is restored causing the main receiver 50 to switch states, the fail-safe timer to reset, and the output to correctly follow the input.

Figure 8:
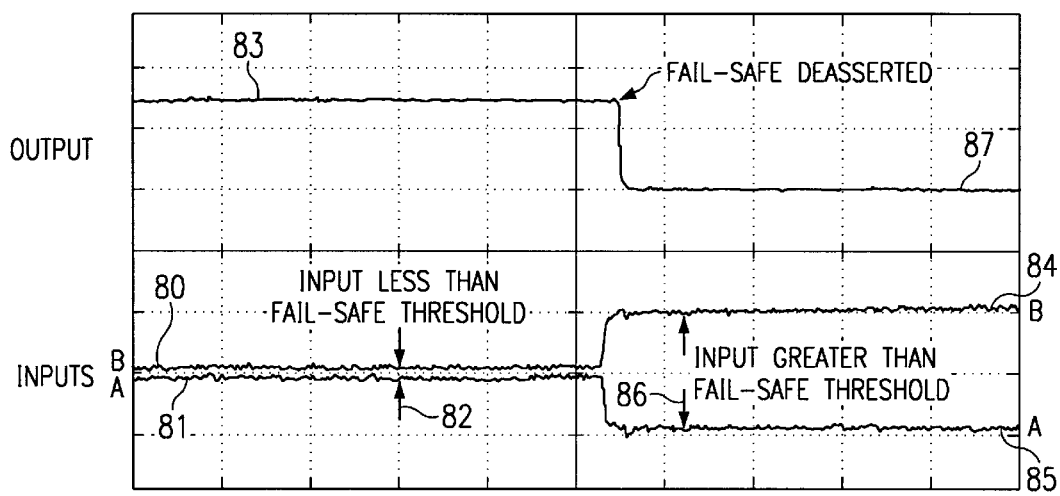
FIG. 8 are waveforms indicating the LVDS receiver operation, using a preferred embodiment of a fail-safe method in accordance with the present invention, after a valid differential input signal has been restored.

As mentioned above, once the fail-safe function has been asserted, the window comparator and logic continue to drive the output to a logic HIGH state as long as the inputs remain within λmV of each other. When a valid differential signal is restored at the input, one of the two window comparators 510 or 511 is driven LOW and the fail-state signal is driven HIGH allowing the output buffer 54 to once again track the input signal, as illustrated in FIG. 8. This shows starting with input signal B 80 larger than A 81 by only 50 mV 82 and $\overline{\text{fail-safe}}$ enabled so that the output 83 is driven to a known logic HIGH level. Then, when the input signal is restored, signal B 84 is greater than A 85 by 400 mV 86 and the fail-safe function is immediately inhibited allowing the receiver 50 to drive the output LOW and once again track the valid input signal.

In operation, if the main receiver 50 does not switch when the input signal is restored, the fail-safe time 52 does not reset. Thus, if the input signal subsequently is reduced in amplitude with no reversal of polarity, the fail-safe function immediately resumes control of the receiver output. On the other hand, if the receiver's output does switch when the signal is restored, the fail-safe timer 52 is reset and any subsequent signal loss is not detected until the timer is allowed to time-out, which is after 600 nSec in the example described above.

Also, active fail-safe operation relies on the hysteresis of the main receiver 50, which is approximately 50 mV in the example given above, to keep $\overline{\text{fail-safe}}$ asserted. If external noise is large enough and the fail-safe function is disabled, $\overline{\text{fail-safe}}$ is not reasserted until the input noise is less than the receiver hysteresis for the entire fail-safe timer period, 600 nSec for this example.

Figure 9:
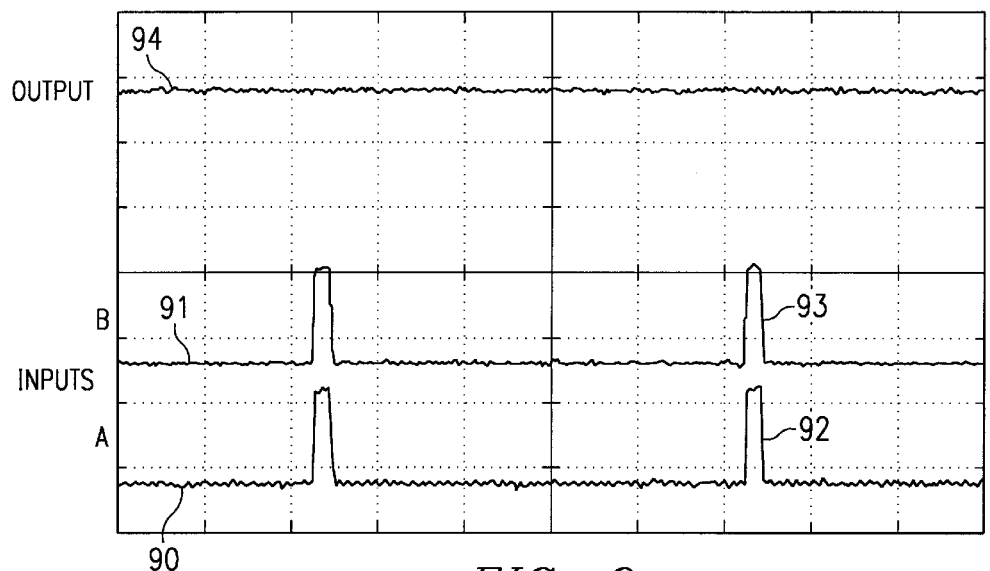
FIG. 9 are waveforms indicating the LVDS receiver operation, using a preferred embodiment of a fail-safe method in accordance with the present invention, which shows the existence of a known output in the presence of common-mode fluctuations on the disconnected input line.

FIG. 9 illustrates the case where both receiver 50 inputs 90/91 are shorted together. Since the fail-safe function is enabled, the output 94 is at a logic HIGH state. Both pins are held initially at ground potential. Any common-mode voltage spikes that may be coupled on to the inputs are not inserted into the system since the output 94 remains at a logic HIGH state, demonstrating the active fail-safe function of the present invention over the entire input common-mode range.

Figure 10:
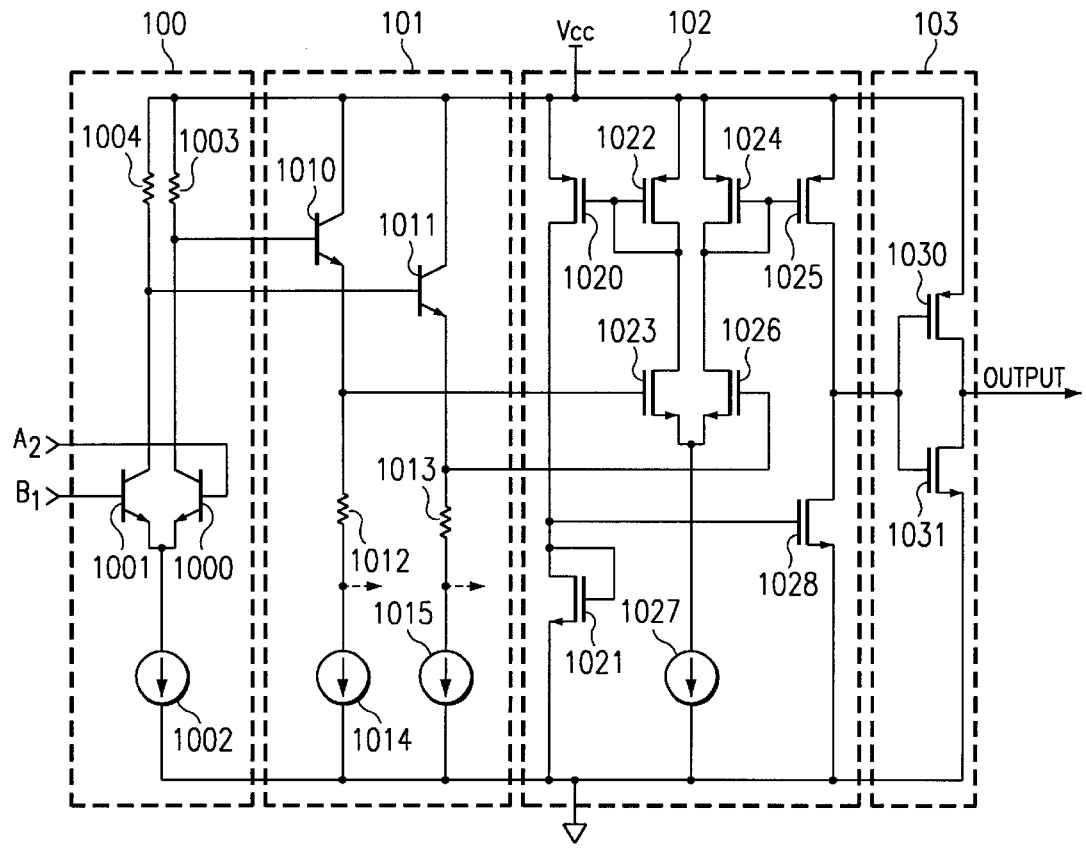
FIG. 10 is a schematic for the two fail-safe comparators used in the window comparator of the embodiment of the present invention disclosed herein.

Circuitry for a preferred embodiment of the apparatus of the present invention, for example as shown in the block diagram of FIG. 5, is discussed below. FIG. 10 is a schematic for one of the window comparators 510 or 511. These comparators, which are considerable slower than that used in the main receiver 50, comprise an input stage 100, a level shifter 101, an output stage 102 that switches from rail-to-rail, and an output buffer 103.

Input stage 100 comprises a bi-polar transistor pair 1000/1001 with the emitters tied together and coupled to a long-tail current source 1002 and the respective collectors coupled to load resistors 1003/1004. The differential input signals A and B are coupled to the bases of transistors 1000 and 1001, respectively. Outputs taken off the collectors of these two transistors are coupled to the inputs of the level shifter 101.

In the level shifter 101, the two signals from the input stage 100 are connected to the bases of two additional bi-polar transistors 1010/1011. Each emitter of these two transistors is coupled to a series resistor 1012/1013 and current source 1014/1015, respectively. Outputs from the two transistors follow the input signals, but are shifted in voltage level depending on the resistor levels and current source levels. Optionally, the outputs can be taken below resistors 1012/1013 to add an offset to the signal.

The output stage 102 is another differential amplifier comprised of two n-channel transistors 1023/1026, whose sources are tied together and coupled to current source 1027 and whose respective drains are coupled to diode-connected p-channel transistors 1022/1024, respectively. The differential output signals from the level shifter 101 are connected to the gates of transistors 1023/1026. The output stage 102 outputs are taken off the drains of the transistors 1023/1026 and coupled into rail-to-rail (Vcc-to-gnd) p-channel/n-channel output transistors 1020/1021 and 1025/1028, respective. N-channel transistor 1021 is also diode-connected with its drain coupled to the gate of n-channel transistor 1028 to provide feedback in the circuit to improve the circuit's response. The single-ended output signal is taken off the common drains of transistors 1025/1028.

Finally, an output buffer stage 103 is added to provide adequate drive capability for the comparator circuit. This is basically a standard NMOS inverter configured using a p-channel transistor 1030 and a n-channel transistor 1031. The input to the buffer is applied to the gates of the two transistors and the output is taken off the drains of the transistors.

Figure 11:
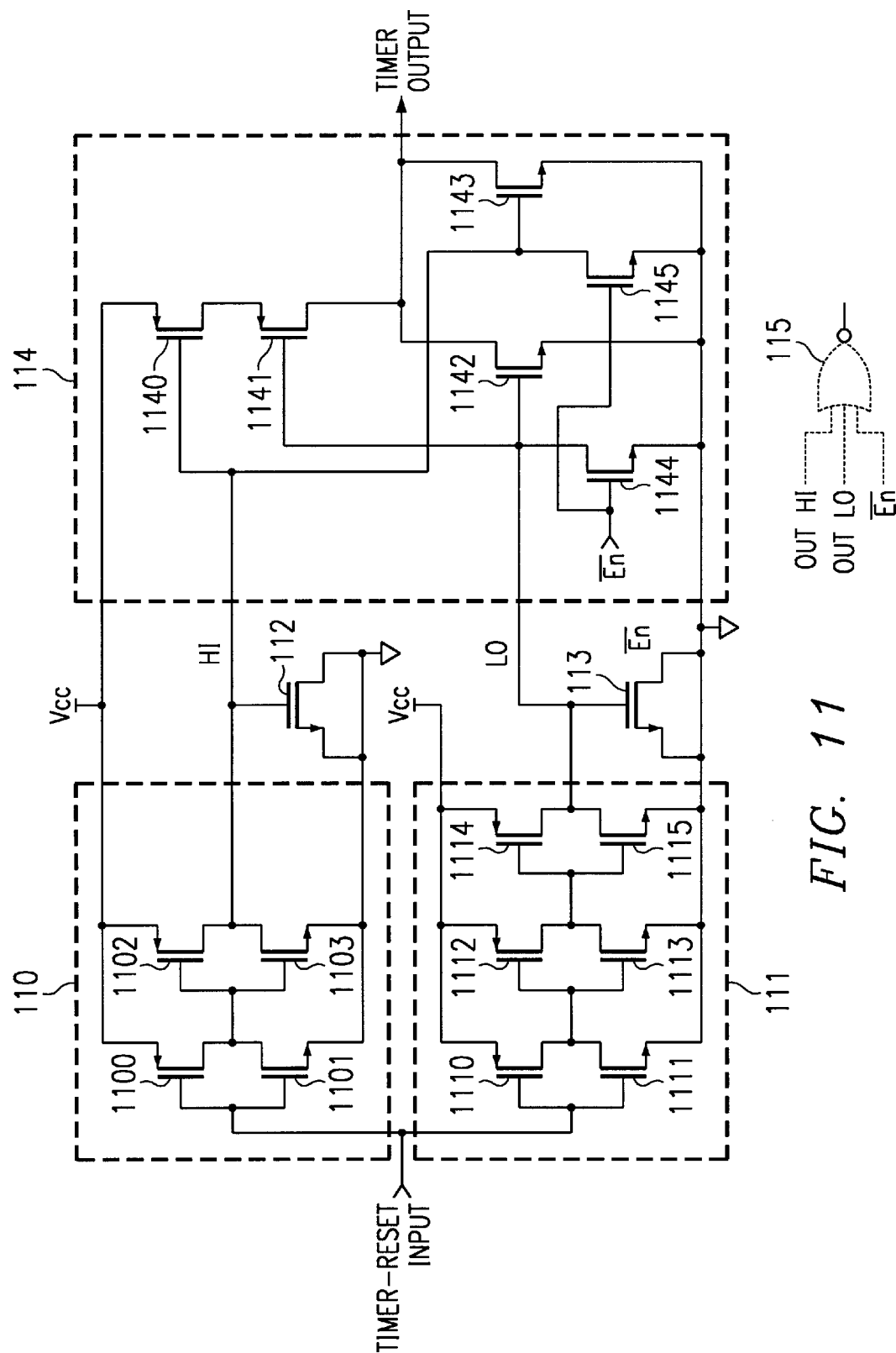
FIG. 11 is a schematic for the activity timer circuit used in the window comparator of the embodiment of the present invention disclosed herein.

FIG. 11 is a schematic for the fail-safe activity timer 52 used in the preferred embodiment described herein. This circuit has to respond to both positive-going and negative-going input signals from the main receiver's 50 output signal, resulting from the input signals switching polarity. As a result, the input signal is coupled in parallel to two out-of-phase inverter banks 110 and 111, respectively. The respective outputs of these inverter banks are loaded by two capacitor—connected n-channel transistors 112/113 and coupled to inputs of output logic circuit 114 (equivalent block diagram 115). The upper non-inverting block 110 consists of two inverters made up of p-channel/n-channel transistor pairs 1100/1101 and 1102/1103, respectively. The polarity of this block is the same as the input timer input signal. The lower inverting block 111 consists of three inverters made up of p-channel/n-channel transistor pairs 1110/1111/ 1112/1113, and 1114/1115, respectively. The polarity of this block is opposite (inverted from) that of the timer input signal. At the nodes where capacitor-connected transistors 112/113 are connected, positive-going signals, where the capacitors are being charged, have a slow rise time (typically 160 n/sec) that is controlled by the layout (L×W) of these transistors. On the other hand, the discharge of these capacitors (fall time) is comparatively faster.

The output NOR gate 114 is comprised of two n-channel transistors 1142/1143, whose drains are tied together at the timer output node. The load for these two output transistors consists of two p-channel transistors 1140/1141 connected between Vcc and the output node. The output (Hi) from the non-inverting input block 110 is coupled to the gate of one n-channel output transistor 1143 and one of the p-channel load transistors 1140, while the output (Lo) from the inverting input block 111 is coupled to the gate of the other n-channel output transistor 1142 and the other p-channel load transistors 1141. The drains of two additional n-channel transistors 1144/1145 are tied to the gates of output transistors 1142/1142, respectively. The gates of these two n-channel transistors are tied together to form a third, $\overline{En}$ input to the NOR gate. The sources of n-channel transistors 1142-1145 are tied to circuit gnd.

In operation, when the input to the timer transitions (either HIGH or LOW), one of the inverter blocks 110 or 111 goes HIGH, charging the appropriate capacitor-connected transistor 112 or 113, thereby causing the output of the timer to momentarily go HIGH for a period of approximately 160 nSec (until the capacitor charges up). The duration is determined by the size of the capacitor-connected transistors 112/113. For example, if the input goes HIGH, the output of inverter block 110 goes HIGH, charging capacitor-connected transistor 112. On the other hand, the output of inverter block 111 immediately goes LOW turning OFF n-channel transistor 1142 and turning ON p-channel transistor 1141. Initially, the gate of p-channel transistor 1140 is LOW, also turning ON p-channel transistor 1140 and pulling the timer output HIGH. Once the capacitor-connected transistor 112 charges up to the threshold value of transistor 1140, this transistor turns OFF and n-channel transistor 1145 turns ON, pulling the timer output LOW. Therefore, the timer output is pulsed HIGH for a time of approximately 160 nSec, delaying the fail-safe function from being enabled during this time.

Figure 12:
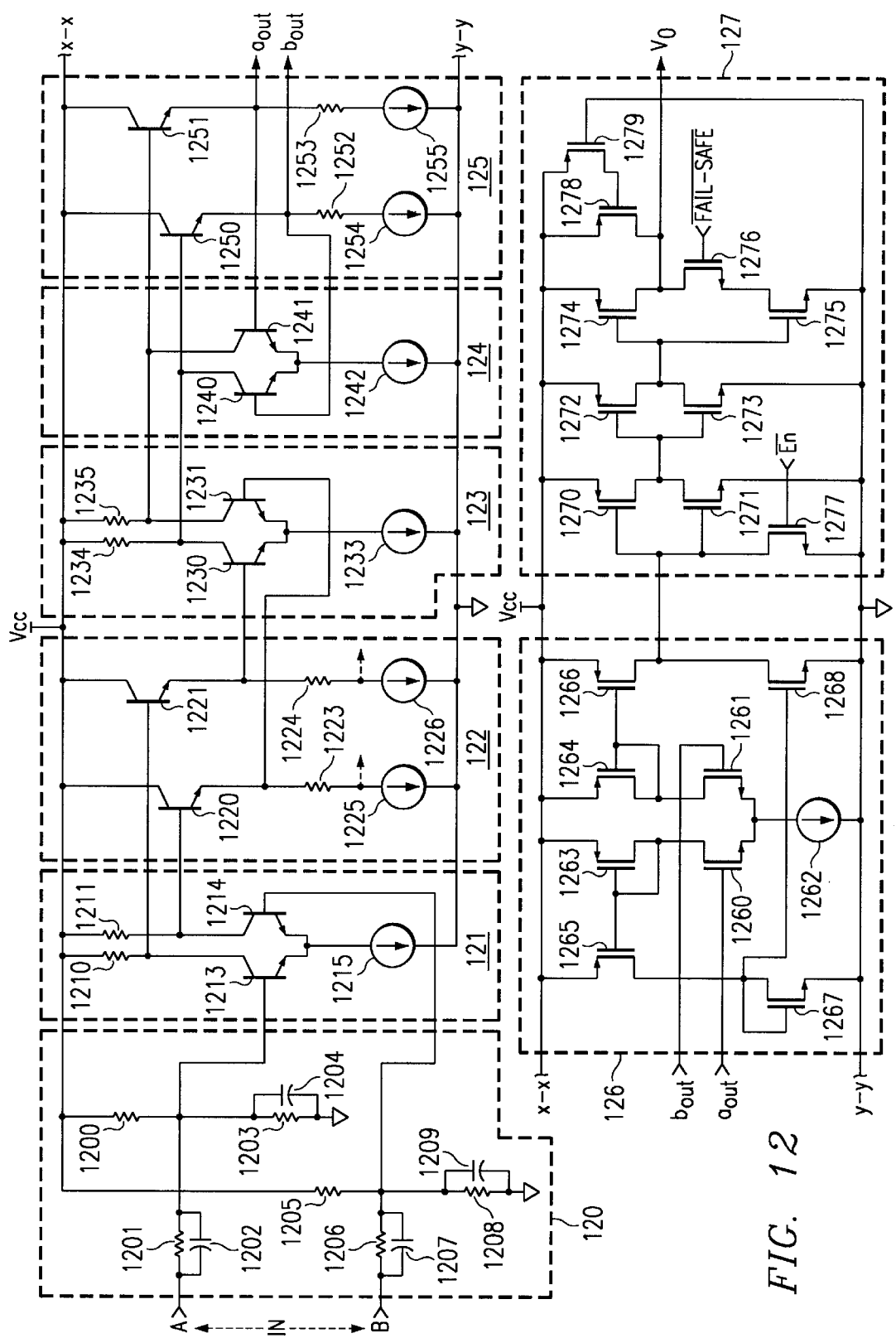
FIG. 12 is a schematic for the LVDS main receiver incorporating a preferred embodiment of an active fail-safe method in accordance with the present invention.

FIG. 12 is a schematic of the main receiver 50 used in the embodiment of the present invention described herein. The receiver is comprised of an input attenuator 120, which is coupled to an input differential amplifier stage 121, which is coupled to a level shifter/offset generator 122, which is coupled to a second stage differential amplifier stage 123, which is coupled to a hysteresis stage 124, which is coupled to a second level shifter 125, which is coupled to an output stage 126, which is coupled to an output buffer stage 127.

The two A and B differential input signals are coupled through input RC networks consisting of resistors 1201/ 1206 and parallel capacitors 1202/1207, respectively, to divider networks comprising resistors 1200/1205 and resistors 1203/1208 in parallel with capacitors 1204/1209. The input signals, which are both attenuated and filtered by these input networks are then coupled into the bases of the first stage 121 differential amplifier npn transistors 1213 and 1214. In a standard fashion, the emitters of these two transistors 1213/1214 are tied together and to circuit gnd through tail current source 1215 and the collectors are coupled to Vdd through resistors 1210 and 1211, respectively. The outputs of the first stage amplifier 121 are taken off the collectors of npn transistors 1213 and 1214 and fed into the level shifter circuit 122. The two legs of the level shifter consist of npn transistors 1220/1221 resistors 1223/ 1224 and tail current sources 1225/1226, respectively. The DC level of the two differential signals is controlled in this circuit by the value of the two resistors 1223/1224 and the amount of current flowing in the current sources 1225/1226. Optionally, the signal can be taken below resistors 1223/ 1224 to add an offset voltage in the circuit. The differential signal is then fed into a second stage amplifier 123, which is also a standard differential amplifier consisting of npn transistors 1230/1231, tail current source 1233 and two load resistors 1234/1235.

A second level shifter 125, similar the first level shifter 122, is used to once again set the level of the differential signals. The two legs of this circuit are made up of npn transistors 1250/1251, resistors 1252/1253, and current sources 1254/1255, respectively. The differential output signals from this level shifter are fed-back into a hysteresis circuit 124, which consists of another differential pair of npn transistors 1240/1241, which are connected to the outputs of the second stage amplifier transistors 1230/1231. The emitters of the hysteresis transistors 1240/1241 are tied together and coupled to gnd through another current source 1242.

This circuit supplies approximately 50 mV of hysteresis to the receiver for the purpose of keeping the $\overline{\text{fail-safe}}$ signal applied. In the case that external noise is large enough to cause the main receiver to switch, the fail-safe timer is reset and the fail-safe function is disabled. $\overline{\text{Fail-safe}}$ will not be reasserted until the input noise level is less than the receiver's hysteresis for the entire fail-safe timer period (approximately 600 nSec).

Next, the output of the second amplifier stage, which has again been level shifted, is coupled into the output amplifier stage 126 where the differential signal is converted into a single-ended, rail-to-rail signal using NMOS circuitry. This circuit consists of a pair of n-channel transistors 1260/1261, a tail current source 1262, and two diode-connected p-channel load transistors 1263/1264, respectively. P-channel transistors 1265/1266 and n-channel transistors 1267/1268 are used to convert the single-ended output signal to rail-to-rail levels (Vcc-to-Gnd in this example).

Finally, the single-ended output signal is fed into an output buffer 127 to provide the $V_0$ output signal capable of driving an appropriate load. This circuit comprises three inverters, which are, in turn, comprised of p-channel and n-channel transistor pairs 1270/1271, 1272/1273, and 1274/1275 and two additional n-channel transistors 1277 and 1276 used to insert an $\overline{\text{En}}$ and $\overline{\text{fail-safe}}$ control signals into the receiver.

In operation, as long as the $\overline{\text{fail-safe}}$ signal is HIGH, transistor 1276 is turned ON and the output tracks the input signal. When $\overline{\text{fail-safe}}$ is driven LOW, transistor 1276 is turned OFF and the output is pulled HIGH by means of p-channel transistors 1278 and 1279. As long as the $\overline{\text{En}}$ signal is LOW the receiver circuit is activated, but if $\overline{\text{En}}$ is set to a logic LOW state, the receiver is disabled. This circuit uses standard building blocks arranged to implement the unique fail-safe function of the present invention. The circuitry provides the frequency response and hysteresis needed to reliably carry out fail-safe function of this invention.

The active fail-safe method of this invention guarantees that the main receiver's 50 output is driven to the fail-safe state when the input pins are shorted (from a crushed cable), left open (an unused receiver), or connected together through a termination resistor when the line driver is disabled or removed.

Following is a detailed summary of the supported fail-safe conditions:

(1) Open Input Pins—In a multipoint or multi-drop configuration, unused nodes can be disconnected from the bus. It is also possible to have multi-channel receivers with a portion of the channels used and unused channels left open. If receiver inputs are left floating, both pins are pulled internally to the same potential. Active Fail-Safe detects this condition and drives the receiver's 50 output to a logic HIGH state.

(2) Idle Bus—If the receiver is connected to an idle bus with the driver in the high impedance state (turned off), the receiver's 50 input pins are pulled to nearly the same voltage via the termination resistor. Normally this would be near the receiver's differential threshold and any external noise would cause the receiver to switch. Active fail-safe detects the low differential input and provides a known logic HIGH output state.

(3) Shorted Inputs Pins—Line-fault conditions (caused by a crushed cable) can result in shorted inputs. Active fail-safe detects the input short and drives the output to the known logic HIGH output state. Active fail-safe functions over the entire receiver input common-mode range, which is important with bus voltage biases, ground offsets or common-mode noise present.

While this invention has been described in the context of preferred embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. An active fail-safe LVDS receiver circuit that provides a known logic level output in the absence of a differential in signal, comprising:

a relatively high-speed main receiver having inputs coupled to a first and second differential input, and having an output;

a window comparator also coupled to said first and second differential inputs consisting of first and second fail-safe comparators, each having a first and a second differential input, wherein the first input of said first fail-safe comparator is coupled to the second input of said fail-safe second comparator and to the second input of said main receiver and the second input of said fail-safe first comparator is coupled to the first input of said second fail-safe comparator and to the first input of said main receiver;

a fail-safe activity timer coupled to the output of said main receiver;

a logic gate having inputs coupled to the outputs of said first and second fail-safe comparators and to the output of said fail-safe timer; and an output buffer having inputs coupled to the output of said main receiver and to the output of said logic gate.

2. The apparatus of claim 1, wherein said window comparators, each further comprise:

an input stage, coupled to and tracking the differential input signal;

a level-shifter coupled to the differential outputs of said input stage, used to adjust the signal's DC level, a rail-to-rail output-stage coupled to the differential output of said level-shifter; and an output buffer coupled to the single-ended output of said rail-to-rail output stage.

3. The apparatus of claim 1, wherein said fail-safe activity timer further comprises:

parallel non-inverting and inverting inverter banks with inputs coupled to and monitoring said main receiver's output;

first and second capacitor-connected transistors coupled to the outputs of said inverter banks;

a 3-input NOR-gate, wherein:

the first input of said NOR-gate is coupled to the output of said non-inverting bank and to the positive side of said first capacitor-connected transistor;

the second input of said NOR-gate is coupled to the output of said inverting bank and to the positive side of said second capacitor-connected transistor; and the third input of said NOR-gate is coupled to an $\overline{\text{fail-safe}}$ input.

4. The apparatus of claim 3, wherein the time constant of said fail-safe activity timer is controlled by the physical size of said first and second capacitor-connected transistors.

5. The apparatus of claim 4, wherein said $\overline{\text{fail-safe}}$ input is used to discharge said capacitor-connected transistors when the circuit is initially turned ON.

6. The apparatus of claim 1, wherein said main receiver further comprises:
   an input attenuator coupled to said differential input signal;
   an input differential amplifier stage coupled to said attenuator outputs;
   a DC level-shifter and offset-generator stage coupled to said input differential amplifier stage;
   a second differential amplifier-stage coupled to the output of said level-shifter and offset-generator stage;
   a second level-shifter stage coupled to the output of said second differential amplifier stage;
   a hysteresis circuit coupled to the output of said second level-shifter stage and in parallel with said second differential amplifier stage;
   an output differential amplifier stage also coupled to the output of said second level-shifter stage; and
   an output buffer stage coupled to the single-ended output of said output differential amplifier stage.

7. The apparatus of claim 6, wherein said input attenuators set the input DC level at approximately 2.5 volts.

8. The apparatus of claim 7, which introduces 50 mV of hysteresis into said receiver circuit.

9. The apparatus of claim 8, wherein said offset-generator introduces up to $\lambda$.mV of temperature compensated internal offset into said receiver.

10. The apparatus of claim 9, which presents minimal bus loading and therefore does not distort of degrade a valid input signal.

11. The apparatus of claim 10, which guarantees that said main receiver's output is driven to a known logic HIGH state in the absence of an input signal, including:
    open input pins;
    floating input pins;
    an idle or tri-stated bus; and
    shorted input pins.

12. The apparatus of claim 11, which maintains a known main receiver output state, in the absence of an input signal, over the entire common-mode range of operation.

13. An active fail-safe method, which prevents an LVDS receiver from switching on input noise in the absence of an input signal, comprising the steps of:
    monitoring both differential inputs on a continuous basis using a window comparator, to detect a loss of input signal;
    if said inputs are within $\lambda$.mV of each other, driving said window comparator outputs HIGH and gating said window comparator outputs with the output of a 600 nSec fail-safe timer; and
    if said input signal is still absent after said timer expires, driving said LVDS receiver's output to a known logic HIGH state and holding said HIGH state until said input signal is restored.

14. The method of claim 13, further comprising the steps of:
    tracking the input signal using said LVDS receiver; and
    switching said LVDS receiver's output when said input signal changes polarity and exceeds 50 mV of hysteresis.

15. The method of claim 14, further comprising the step of: resetting said fail-safe timer such that it begins timing from 0 to 600 nSec, each time said main receiver switches.

16. The method of claim 15, further comprising the step of:
    asserting a $\overline{\text{fail-safe}}$ signal to drive said receiver's output to a logic HIGH state, if said timer expires and said input signal difference is less than 80 mV.

17. The method of claim 16, further comprising the step of:
    substantially immediately driving said receiver's output low and again tracking said input signal, when a valid input signal is restored.

18. The method of claim 17, further comprising the step of:
    driving said receiver's output to a logic HIGH state 600 nSec after said differential input signal's absence is detected; and
    beginning tracking said differential input signal with said receiver's output substantially immediately after input signal is restored.

19. The method of claim 18, further comprising the step of:
    presenting minimal bus loading to thereby minimize distortion and degradation of a valid input signal.

20. A fail-safe circuit that provides a known logic level output in the absence of a differential input signal, comprising:
    a relatively high-speed receiver having inputs coupled to a first and second differential input, and having an output;
    a window comparator also coupled to said first and second differential inputs, comprising first and second comparators, each having a first and a second differential input, wherein the first input of said first comparator is coupled to the second input of said second comparator and to the second input of said receiver and the second input of said first comparator is coupled to the first input of said second comparator and to the first input of said receiver;
    a timer coupled to the output of said receiver;
    a logic circuit having inputs coupled to the outputs of said first and second comparators and to the output of said timer, providing an active output only when all inputs are active; and
    an output buffer having inputs coupled to the output of said receiver and to the output of said logic circuit, such that said output buffer provides an output corresponding to the output of said receiver when the output of said logic circuit is inactive, and provides an output having a predetermined logic state when said logic circuit is active.

21. The apparatus of claim 20, configured so as to maintain a known receiver output state, in the absence of an input signal, over the entire common-mode range of operation.

* * * * *